(12) United States Patent
Wu et al.

(10) Patent No.: US 11,616,080 B2
(45) Date of Patent: Mar. 28, 2023

(54) THREE-DIMENSIONAL MEMORY DEVICE WITH FERROELECTRIC MATERIAL

(71) Applicant: Taiwan Semiconductor Manufacturing Co., Ltd., Hsinchu (TW)

(72) Inventors: Chao-I Wu, Zhubei (TW); Yu-Ming Lin, Hsinchu (TW); Han-Jong Chia, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 56 days.

(21) Appl. No.: 17/033,006

(22) Filed: Sep. 25, 2020

(65) Prior Publication Data

US 2021/0375928 A1 Dec. 2, 2021

Related U.S. Application Data

(60) Provisional application No. 63/031,660, filed on May 29, 2020.

(51) Int. Cl.
*H01L 27/1159* (2017.01)
*H01L 27/11597* (2017.01)
*H01L 29/66* (2006.01)
*H01L 29/78* (2006.01)
*H01L 21/02* (2006.01)
*H01L 29/24* (2006.01)

(52) U.S. Cl.
CPC .... *H01L 27/1159* (2013.01); *H01L 21/02565* (2013.01); *H01L 27/11597* (2013.01); *H01L 29/24* (2013.01); *H01L 29/66969* (2013.01); *H01L 29/78391* (2014.09)

(58) Field of Classification Search
None
See application file for complete search history.

(56) References Cited

U.S. PATENT DOCUMENTS

| | | | | |
|---|---|---|---|---|
| 2020/0212068 A1* | 7/2020 | Lee | .................... | H01L 29/42372 |
| 2020/0357821 A1* | 11/2020 | Chen | ................. | H01L 27/11597 |
| 2021/0202703 A1* | 7/2021 | Rajashekhar | ..... | H01L 29/40117 |
| 2021/0272983 A1* | 9/2021 | Gilbert | .................... | H01L 45/10 |

* cited by examiner

*Primary Examiner* — Vincent Wall
(74) *Attorney, Agent, or Firm* — Slater Matsil, LLP

(57) ABSTRACT

A memory device includes: a first layer stack and a second layer stack formed successively over a substrate, where each of the first and the second layer stacks includes a first metal layer, a second metal layer, and a first dielectric material between the first and the second metal layers; a second dielectric material between the first and the second layer stacks; a gate electrode extending through the first and the second layer stacks, and through the second dielectric material; a ferroelectric material extending along and contacting a sidewall of the gate electrode; and a channel material, where a first portion and a second portion of the channel material extend along and contact a first sidewall of the first layer stack and a second sidewall of the second layer stack, respectively, where the first portion and the second portion of the channel material are separated from each other.

20 Claims, 17 Drawing Sheets

THREE-DIMENSIONAL MEMORY DEVICE WITH FERROELECTRIC MATERIAL

PRIORITY CLAIM AND CROSS-REFERENCE

This application claims the benefit of U.S. Provisional Application No. 63/031,660, filed on May 29, 2020 and entitled "Selective Metal Oxide Growth for 3D NOR Structure," which application is hereby incorporated herein by reference.

TECHNICAL FIELD

The present invention relates generally to semiconductor memory devices, and, in particular embodiments, to three-dimensional memory devices with ferroelectric material and selective growth of a channel material.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
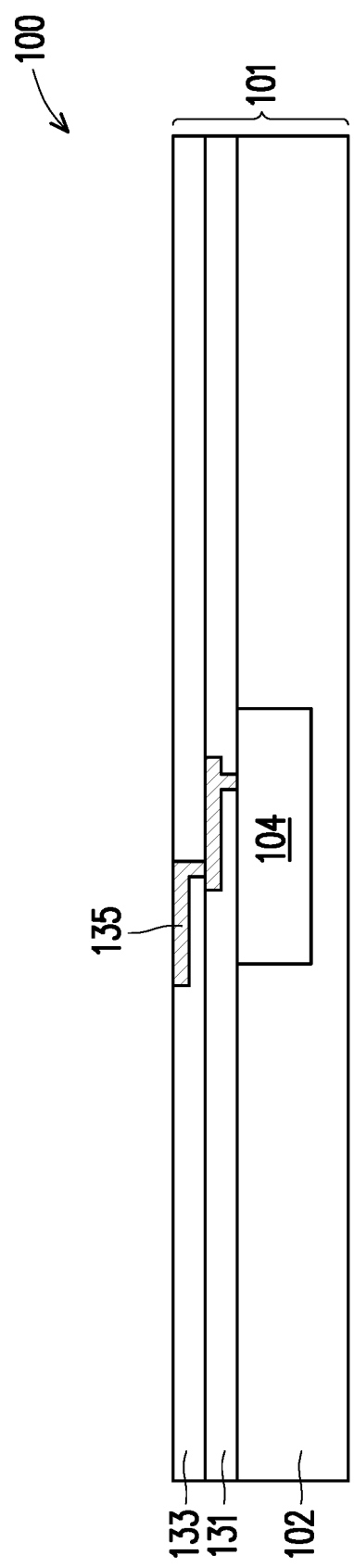
FIGS. 1-7, 8A and 8B illustrate cross-sectional views of a three-dimensional memory device at various stages of manufacturing, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar process using a same or similar material(s).

In some embodiments, a three-dimensional (3D) memory device includes a first layer stack and a second layer stack formed over a substrate, and an isolation layer between the first layer stack and the second layer stack. Each of the first layer stack and the second layer stack includes a first source/drain layer, a second source/drain layer, and a dielectric layer in between. The 3D memory device further includes a gate electrode extending through the first layer stack, the isolation layer, and the second layer stack; a channel material having a first portion extending along a sidewall of the first layer stack, and a second portion extending along a sidewall of the second layer stack, where the first portion is spaced apart from the second portion; and a ferroelectric material between the channel material and the gate electrode. The sidewall of the isolation layer facing the gate electrode is free of the channel material and is covered by the ferroelectric material.

FIGS. 1-7, 8A and 8B illustrate cross-sectional views of a three-dimensional (3D) memory device 100 at various stages of manufacturing, in an embodiment. The 3D memory device 100 is a three-dimensional memory device with a ferroelectric material, and may be, e.g., a 3D NOR-type memory device.

Referring to FIG. 1, electrical components 104, such as transistors, resistors, capacitors, inductors, diodes, or the like, are formed in a device region of a semiconductor substrate 102 in the front-end-of-line (FEOL) processing of semiconductor manufacturing. The semiconductor substrate 102 may be a bulk substrate, such as a silicon substrate, doped or undoped, or an active layer of a semiconductor-on-insulator (SOI) substrate. The semiconductor substrate 102 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The electrical components 104 may be formed in/on the semiconductor substrate 102 using any suitable formation method known or used in semiconductor manufacturing.

After the electrical components 104 are formed, interconnect structures are formed over the semiconductor substrate 102 to connect the electrical components 104 to form functional circuits. The interconnect structures include a plurality of dielectric layers (e.g., 131, 133) and electrically conductive features 135 (e.g., vias, metal lines) formed in the dielectric layers. The interconnect structures are formed in the back-end-of-line (BEOL) processing of semiconductor manufacturing, in some embodiments. Formation of interconnect structures are known in the art, thus details are not repeated here. To avoid clutter and for ease of discussion, the semiconductor substrate 102, the electrical components 104, and the interconnect structures over the semiconductor substrate 102 are collectively referred to as a substrate 101 in the discussion hereinafter, and the details of the substrate 101 illustrated in FIG. 1 may be omitted in subsequent figures.

Figure 2:
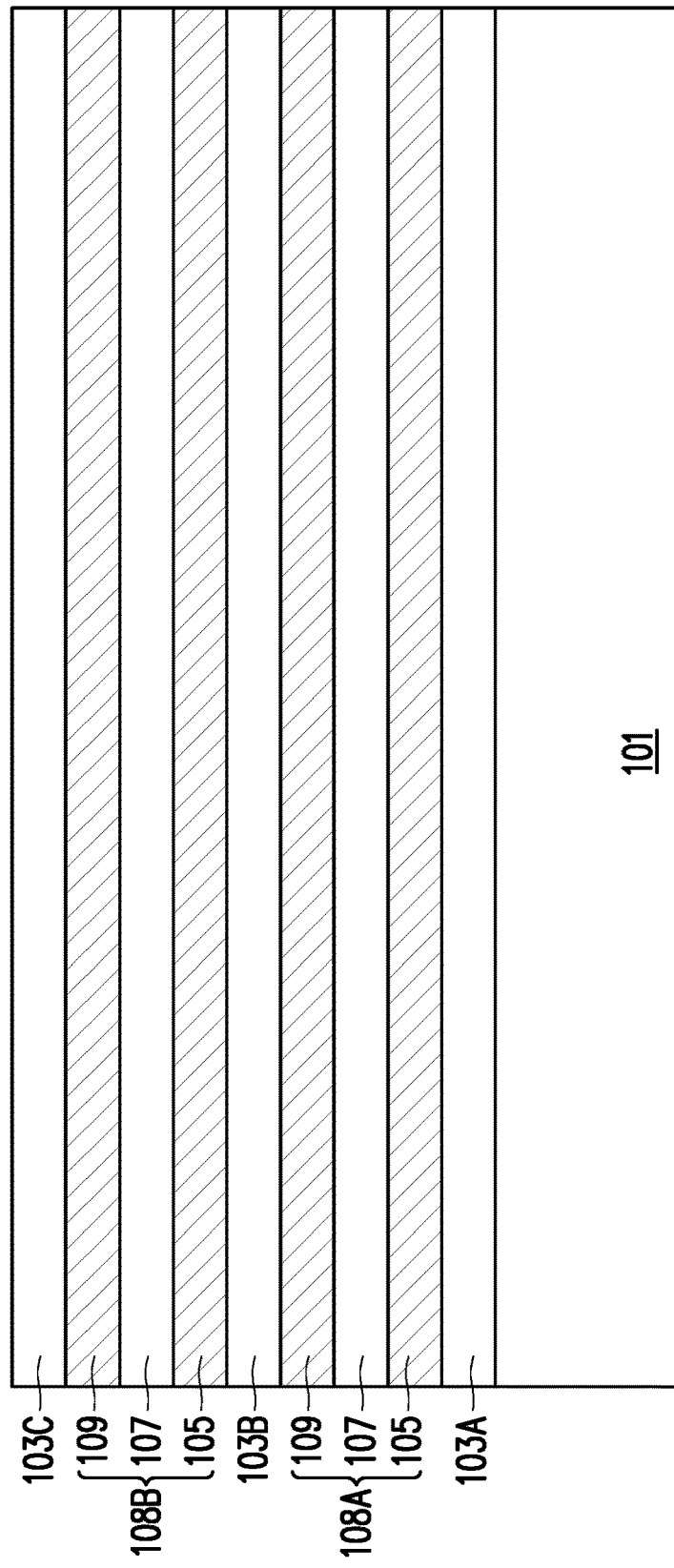

FIGS. 2-7, 8A and 8B illustrate additional processing steps in the BEOL processing to from the 3D memory device 100, in an embodiment. Referring now to FIG. 2, an isolation layer 103A is formed on the substrate 101. The isolation layer 103A is formed of a dielectric material. For example, the isolation layer 103A may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, chemical vapor deposition (CVD), or the like.

Next, a first layer stack 108A is formed over the isolation layer 103A. In the illustrated embodiment, the first layer stack 108A includes a first source/drain layer 105, a dielectric layer 107, and a second source/drain layer 109 formed successively over the substrate 101. In some embodiments, the first source/drain layer 105 and the second source/drain layer 109 are formed of a same source/drain material. In the example of FIG. 2, the first source/drain layer 105 and the second source/drain layer 109 are formed of a same metal material, such as W, Ru, or the like, and therefore, the first source/drain layer 105 and the second source/drain layer 109 may also be referred to as a first source/drain metal layer 105 and a second source/drain metal layer 109, respectively.

Depending on the type (e.g., N-type or P-type) of device formed, the first source/drain metal layer 105 and the second source/drain metal layer 109 may be formed of an N-type metal or a P-type metal. In some embodiments, Sc, Ti, Cr, Ni, Al, or the like, is used as the N-type metal for forming the first source/drain metal layer 105 and the second source/drain metal layer 109. In some embodiments, Nb, Pd, Pt, Au, or the like, is used as the P-type metal for forming the first source/drain metal layer 105 and the second source/drain metal layer 109. The N-type or P-type metal layer may be formed of a suitable formation method such as PVD, CVD, ALD, or the like. The dielectric layer 107 may be formed of a suitable dielectric material, such as silicon oxide, silicon nitride, silicon oxynitride, or the like. A suitable formation method, such as PVD, CVD, or the like, may be used to form the dielectric layer 107.

After the first layer stack 108A is formed, an isolation layer 103B is formed over the first layer stack 108A. In the illustrated embodiment, the isolation layer 103B is formed of a same material as the isolation layer 103A using a same formation method. Therefore, details are not repeated. In some embodiments, the isolation layer 103B is formed of a different dielectric material from the isolation layer 103A.

Next, a second layer stack 108B is formed over the isolation layer 103B. The second layer stack 108B has a same structure as the first layer stack 108A and is formed using a same formation method(s) and materials as the first layer stack 108A, in the illustrated embodiment. For example, the second layer stack 108B includes the first source/drain layer 105, the dielectric layer 107, and the second source/drain layer 109 formed successively over the isolation layer 103B.

Next, an isolation layer 103C is formed over the second layer stack 108B. In the illustrated embodiment, the isolation layer 103C is formed of a same material as the isolation layer 103A using a same formation method. Therefore, details are not repeated. In some embodiments, the isolation layer 103C is formed of a different dielectric material from the isolation layer 103A. For ease of discussion, the first layer stack 108A and the second layer stack 108B may be collectively referred to as layer stacks 108 herein, and the isolation layer 103A, the isolation layer 103B, the isolation layer 103C may be collectively referred to as isolation layers 103. In addition, the first source/drain layer 105 and the second source/drain layer 109 may be collectively referred to as the source/drain layers 105/109.

Figure 3:
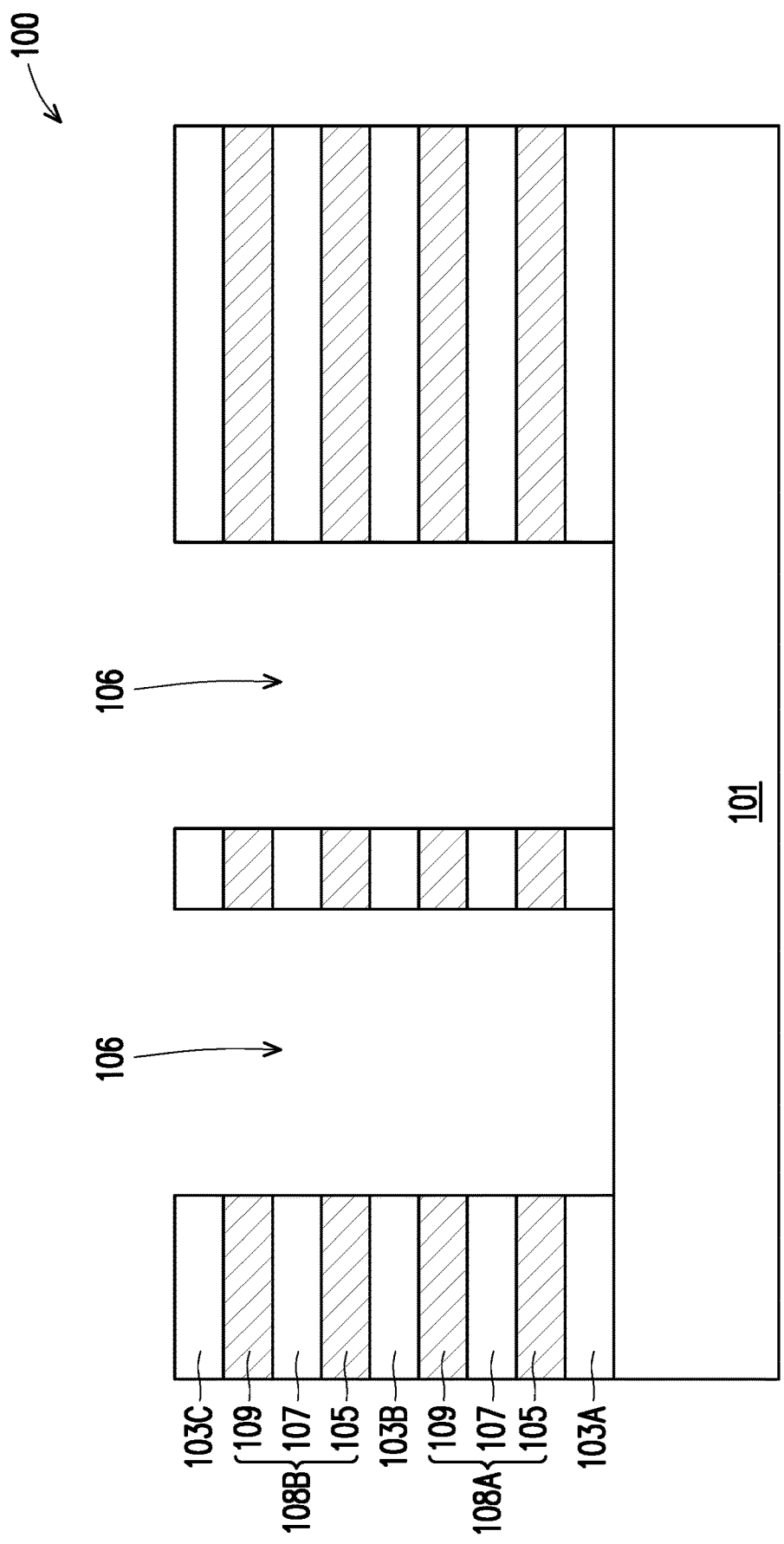

Next, in FIG. 3, openings 106 are formed to extend through the isolations layers 103 (e.g., 103A, 103B, 103C) and the layer stacks 108 (e.g., 108A, 108B). As illustrated in FIG. 3, the substrate 101 is exposed at the bottoms of the openings 106. In addition, the openings 106 expose sidewalls of the isolations layers 103 (e.g., 103A, 103B, 103C) and sidewalls of the layer stacks 108 (e.g., 108A, 108B). Note that in the discussion herein, a sidewall of the first layer stack 108A (or the second layer stack 108B) may refer to a common (e.g., shared) sidewall of all the constituent layers (e.g., 105, 107, and 109) of that layer stack when the sidewalls of all the constituent layers are aligned (e.g., vertically), or may refer to one of the sidewalls of the constituent layers (e.g., when the constituent layers have more than one sidewalls that are not aligned). For example, a sidewall of the first layer stack 108A (or the second layer stack 108B) exposed by the opening 106 in FIG. 3 includes the sidewall of the first source/drain layer 105, the sidewall of the dielectric layer 107, and the sidewall of the second source/drain layer 109 that are vertically aligned due to, e.g., an anisotropic etching process to form the opening 106. As another example, in FIG. 13A, a sidewall of the layer stack 108A may refer to a sidewall of the dielectric layer 107, or a sidewall of the source/drain layer 105. Note that in FIG. 13A, the sidewall of the dielectric layer 107 is not aligned (e.g., along the vertical direction) with the sidewall of the source/drain layer 105, due to the dielectric layer 107 being recessed by a selective etching process.

Still referring to FIG. 3, in some embodiments, the openings 106 are formed by an anisotropic etching process, such as a plasma etching process. A patterned mask layer, such as a patterned photoresist, may be formed over the isolation layer 103C. The anisotropic etching process may then be performed using the patterned mask layer as an etching mask to form the openings 106. After the anisotropic etching process is finished, the patterned mask layer (e.g., patterned photoresist) may be removed by a suitable removal process, such as ashing or stripping.

Figure 4:
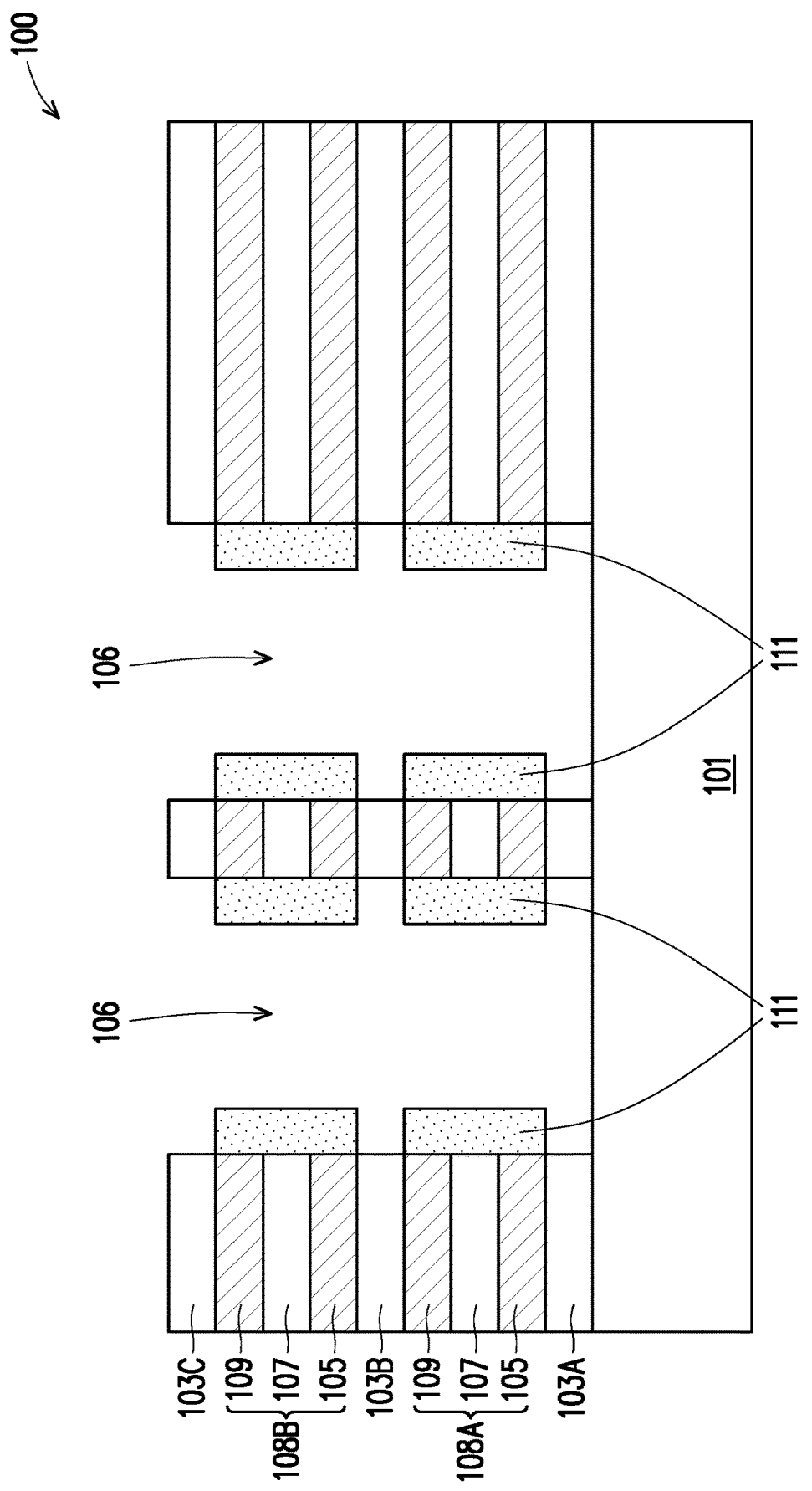

Next, in FIG. 4, a channel material 11 is selectively formed in the openings 106 over exposed sidewalls of the layer stacks 108 (e.g., 108A, 108B). As illustrated in FIG. 4, after the selective deposition of the channel material 11, sidewalls of the layer stacks 108 previously exposed by the openings 106 are now covered by the channel material 111, while sidewalls of the isolation layers 103 (e.g., 103A, 103B, 103C) facing the openings 106 are free of (e.g., not covered by) the channel material 111. The channel material 111 functions as the channel layer between the first source/drain layer 105 and the second source/drain layer 109, in the illustrated embodiment.

In some embodiments, the selective deposition (may also be referred to as selective growth) of the channel material 11 is achieved by using different materials for the layer stacks 108 and the isolation layers 103. For example, the first source/drain layer 105 and the second source/drain layer 109 are formed of a metal, the dielectric layer 107 is formed of a first dielectric material, and the metal and the first dielectric material of the layer stacks 108 are chosen such that a first deposition rate (or growth rate) of the channel material 11 on the metal and a second deposition rate of the channel material 11 on the first dielectric material are substantially the same or are similar (e.g., the first deposition rate is within about 80% to about 120% of the second deposition rate). In addition, the isolation layer 103 is formed of a second dielectric material different from the first dielectric material, such that a third deposition rate of the channel material 11 on the isolation layer 103 is smaller than the first deposition rate and is smaller than the second deposition rate. In some embodiments, the third deposition rate is zero or almost zero. In some embodiments, the third deposition rate is less than, e.g., about 10% of the first deposition rate or less than about 10% the second deposition rate.

In some embodiments, after the selective deposition of the channel material 111, an optional etching process using an etchant selective to (e.g. having a higher etching rate for) the channel material 111 is performed to remove the channel material 111 from the sidewalls of the isolation layers 103 (if formed). Note that due to the differences in the deposition rates of the channel material 111, the thickness of the channel material 111 on the sidewalls of the isolation layer 103 is much smaller than that of the channel material 111 on the sidewalls of the layer stacks 108. The optional etching process may be a timed etching process, and is stopped once the sidewalls of the isolation layer 103 are exposed, such that the channel material 111 still covers the sidewalls of the layer stacks 108 to form channel layers. In embodiments where the third deposition rate of the channel material 111 on the isolation layer 103 is zero, the above optional etching process described above is omitted.

In some embodiments, the channel material 111 is a metal oxide, such as indium gallium zinc oxide (IGZO), formed by a suitable formation method, such as PVD, CVD, ALD or the like. Other suitable materials for the channel material 11 include zinc oxide (ZnO), indium tungsten oxide (IWO), tungsten oxide (WO), tantalum oxide (TaO), and molybdenum oxide (MoO). In an example embodiment, the first source/drain layer 105 and the second source/drain layer 109 are formed of tungsten, the dielectric layer 107 is formed of SiO2, and the channel material 111 is formed of IGZO.

As illustrated in FIG. 4, the channel material 11 is formed to cover (e.g., physically contacts and extends along) sidewalls of the layer stacks 108, but does not cover sidewalls of the isolation layer 103. In other words, the channel material 11 comprises discrete segments (or portions) that are spaced apart from each other. By not forming the channel material 11 over the sidewalls of the isolation layer 103 between adjacent layer stacks 108, leakage current between subsequently formed memory cells are avoided or reduced, details of which are discussed hereinafter.

Figure 5:
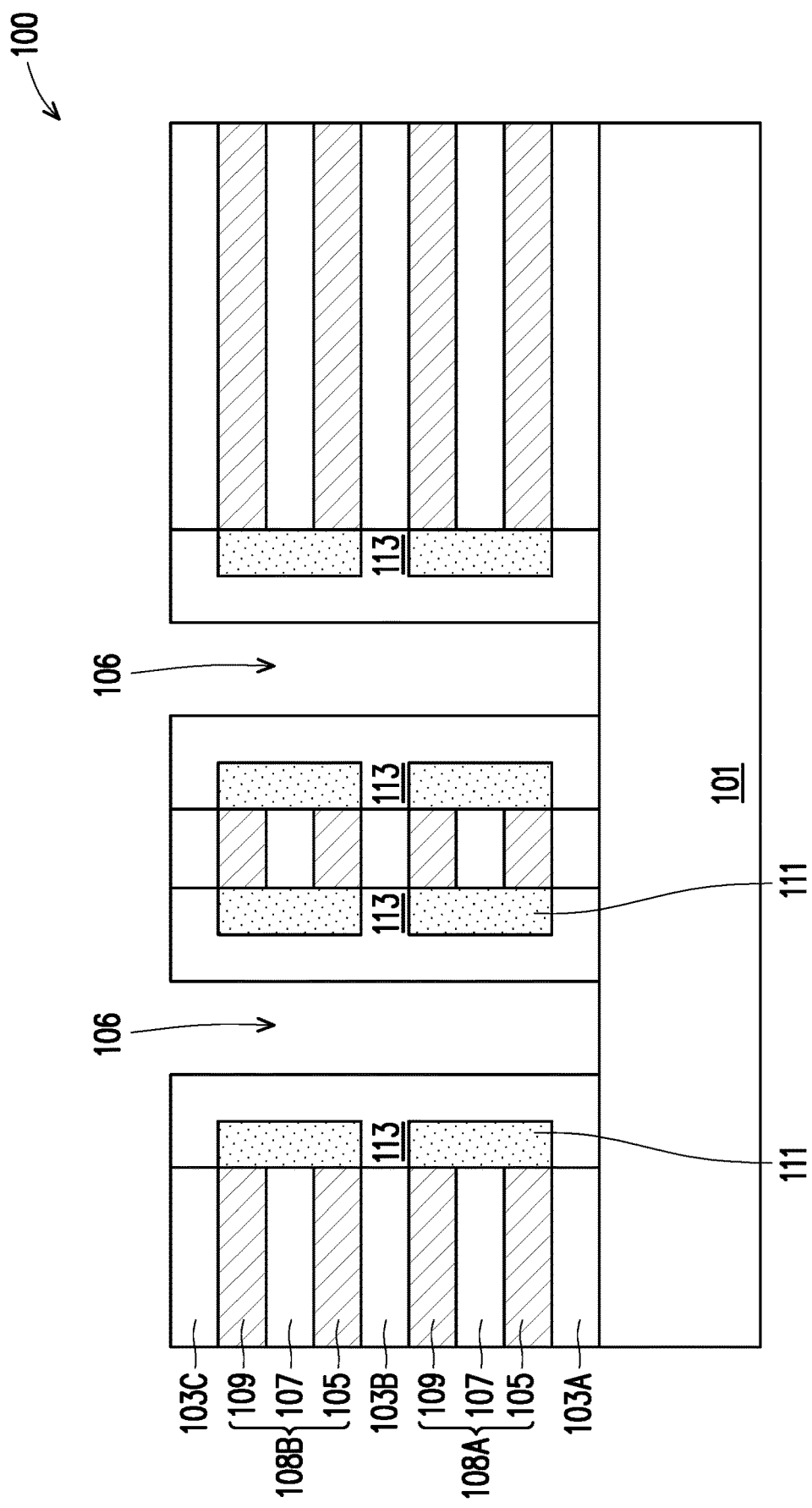

Next, in FIG. 5, a ferroelectric material 113 is formed in the openings 106. The ferroelectric material 113 may be, e.g., HZO, HSO, HfSiO, HfLaO, HfO2, HfZrO2, ZrO2, or HfO2 doped by La, Y, Si, or Ge, and may be formed by, e.g., PVD, CVD, atomic layer deposition (ALD), or the like. In some embodiments, the ferroelectric material 113 is formed to line sidewalls and bottoms of the openings 106. The ferroelectric material 113 may also be formed over the upper surface of the isolation layer 103C. Next, an anisotropic etching process (e.g., a plasma etching process) is performed to remove the ferroelectric material 113 from the bottoms of the openings 106 and from the upper surface of the isolation layer 103C. As illustrated in FIG. 5, after the anisotropic etching process, the substrate 101 is exposed at the bottoms of the openings 106, and the ferroelectric material 113 extends into gaps between portions of the channel material 11 and covers (e.g., physically contacts and extends along) sidewalls of the isolation layers 103. The ferroelectric material 113 also covers (e.g., physically contacts and extends along) the upper surface, the lower surface, and a sidewall of each portion of the channel material 11.

Figure 6:
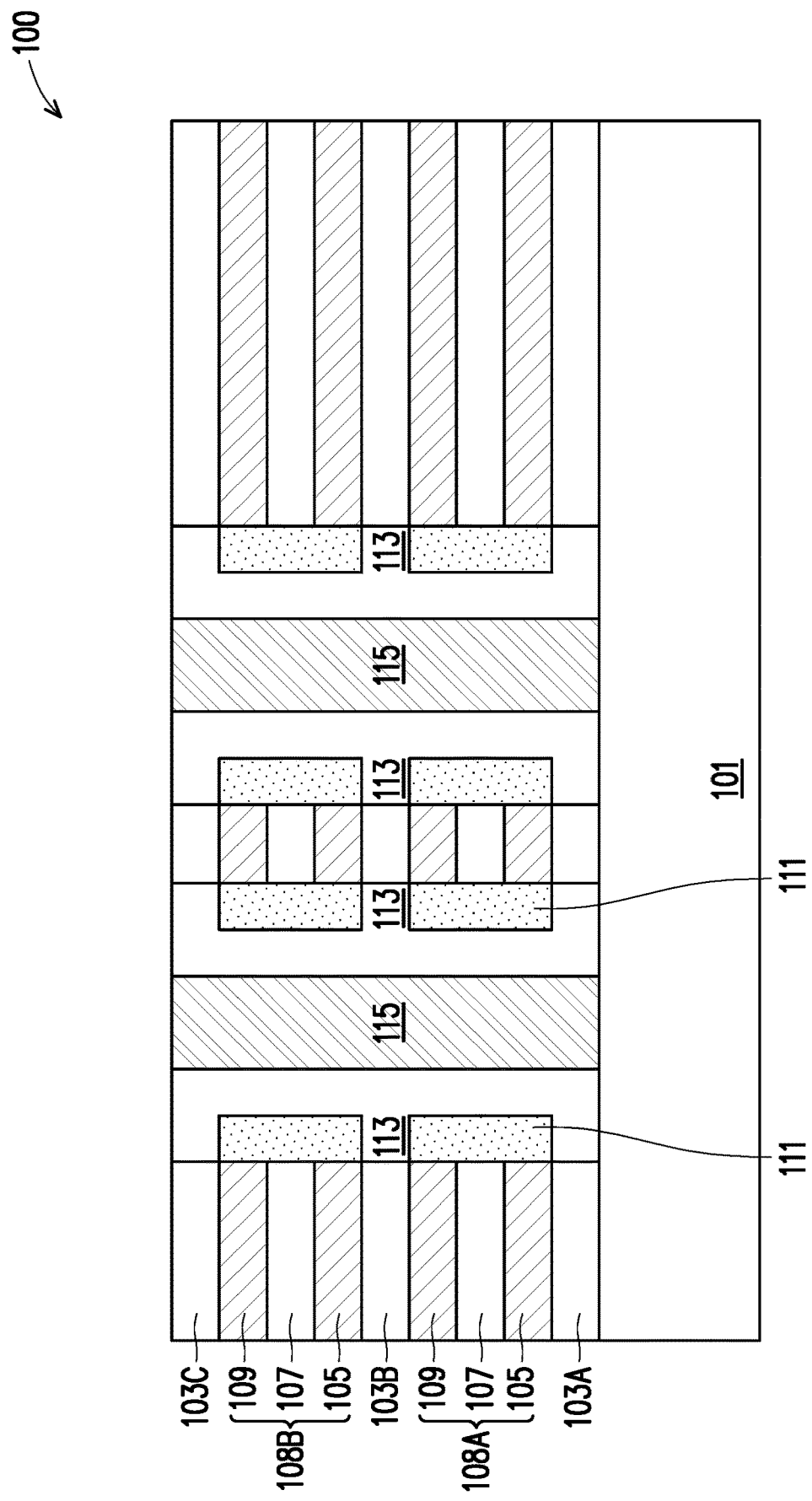

Next, in FIG. 6, an electrically conductive material is formed in the openings 106 and fills the openings 106. The electrically conductive material may be, e.g., copper, tungsten, cobalt, aluminum, tungsten nitride, rhuthenium, silver, gold, rhodium, molybdenum, nickel, cadmium, zinc, alloys thereof, combinations thereof, and the like, and may be formed by a suitable deposition method such as CVD, PVD, ALD, plating, or the like. After the electrically conductive material is formed, a planarization process, such as chemical mechanical planarization (CMP), may be performed to remove excessive portions of the electrically conductive material from the upper surface of the isolation layer 103C, and remaining portions of the electrically conductive material form gate electrodes 115.

Figure 7:
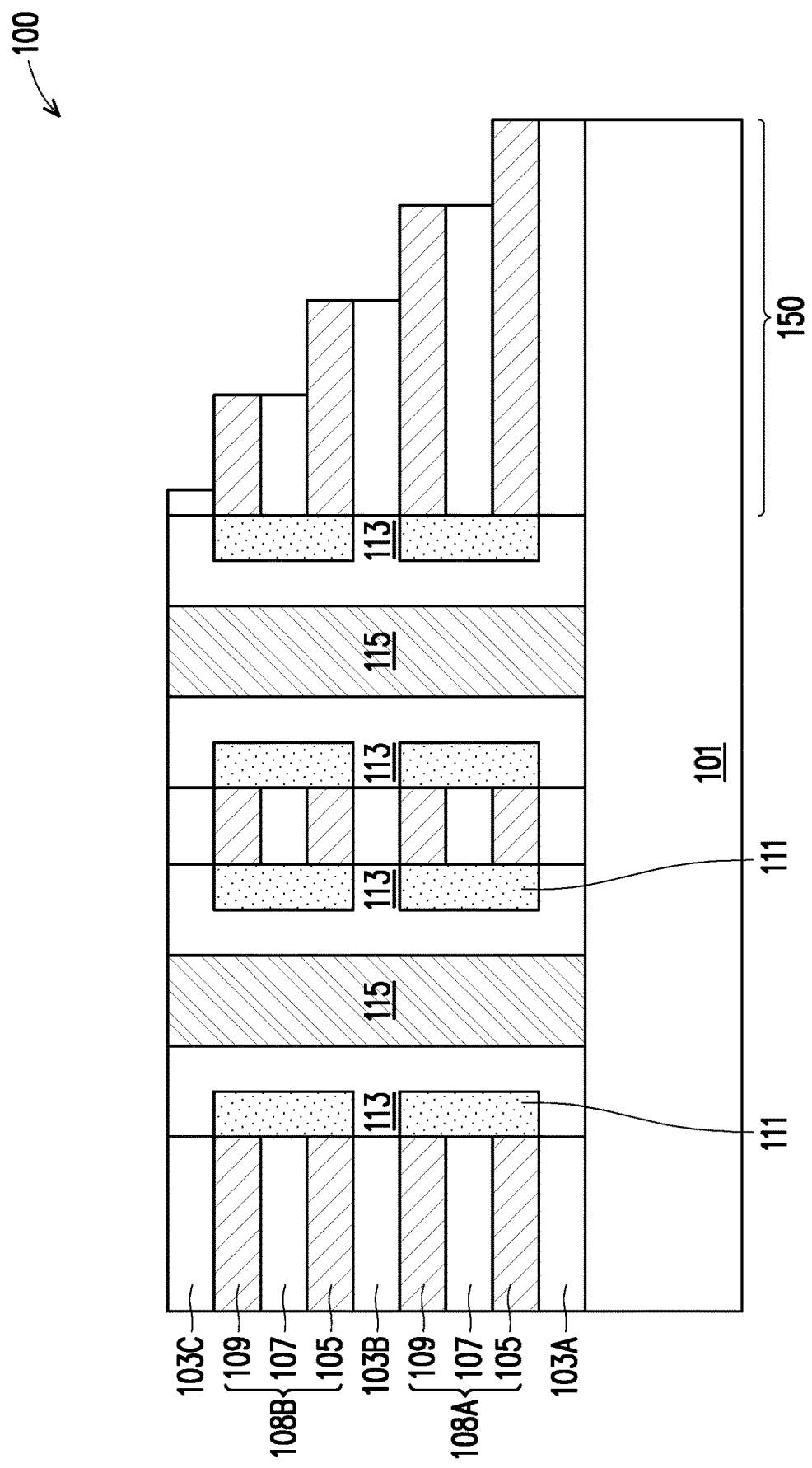

Next, in FIG. 7, a staircase shaped region 150 is formed in the 3D memory device 100. The staircase shaped region 150 is formed by a plurality of etching processes (e.g., anisotropic etching processes) using different etching masks. The etching time for each of the plurality of etching processes may be adjusted to achieve different amount (e.g., depth) of etching.

As illustrated in FIG. 7, after the staircase shaped region 150 is formed, a portion of the upper surface of each of the source/drain layers 105/109 is exposed. In the example of FIG. 7, each of the source/drain layers 105/109 has a same width (measured along the horizontal direction of FIG. 7) with, and physically contacts, a respective underlying layer (e.g., 107 or 103), such that the sidewall of each of the source/drain layers 105/109 in the staircase shaped region 150 is aligned along a same line with a respective sidewall of the underlying layer (e.g., 107 or 103). In addition, respective widths of the source/drain layers 105/109 increase in a direction toward the substrate 101, such that the topmost source/drain layer (e.g., the second source/drain layer 109 of the second layer stack 108B) has the smallest width, and the bottommost source/drain layer (e.g., the first source/drain layer 105 of the first layer stack 108A) has the largest width. The staircase shaped region 150 facilitates access to each of the source/drain layers 105/109 for the subsequently formed source/drain contacts 119SD (see FIG. 8A).

Figure 8A:
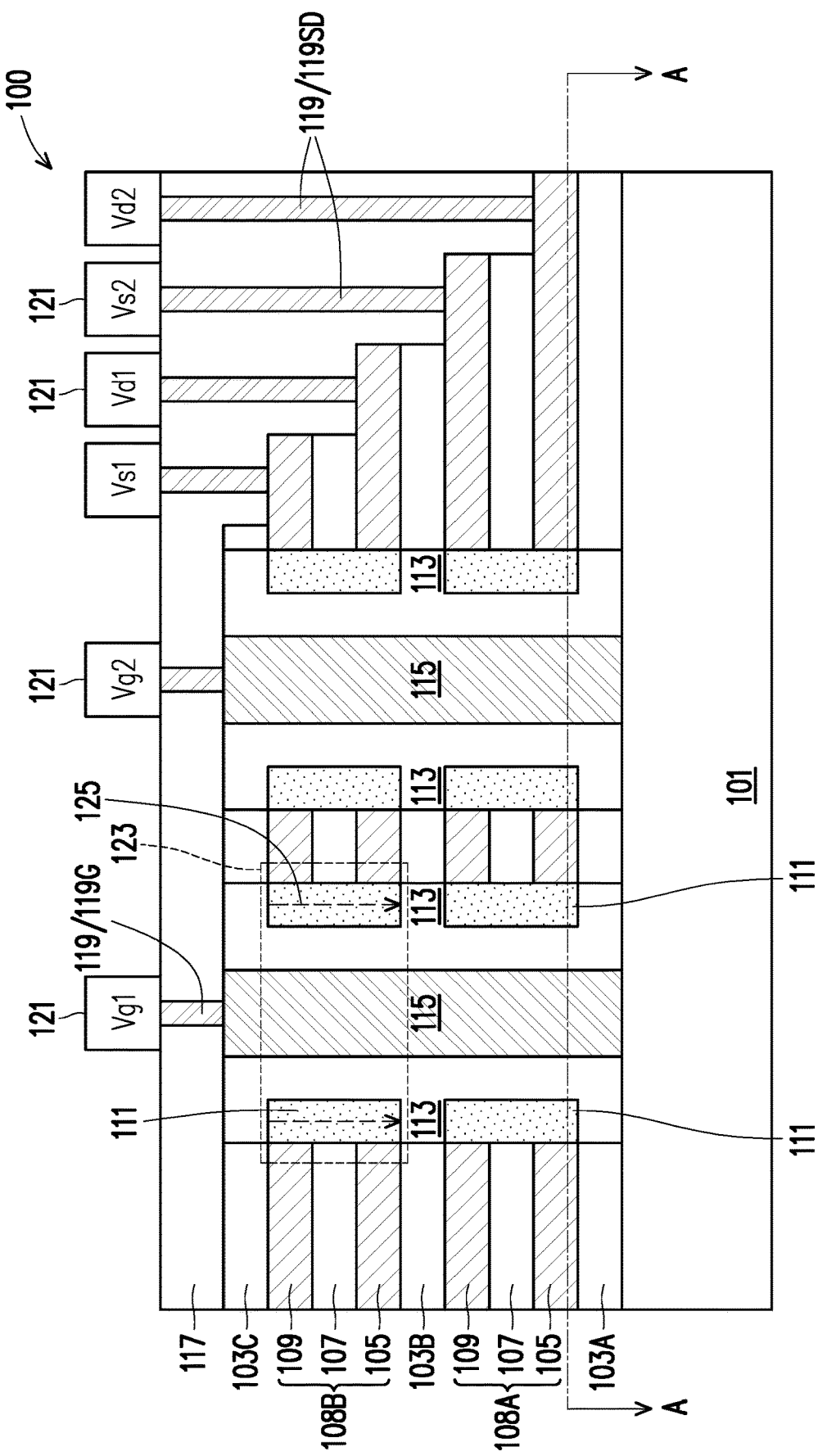

Next, in FIG. 8A, a dielectric material 117 is formed over the structure of FIG. 7. Contacts 119 (also referred to as contact plugs) are formed in the dielectric material 117 and electrically coupled to the gate electrodes 115 or the source/drain layers 105/109. The contacts 119 electrically coupled to the gate electrodes 115 are also referred to as gate contacts 119G, and contacts 119 electrically coupled to the source/drain layers 105/109 are also referred to as source/drain contacts 119SD.

The dielectric material 117 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, chemical vapor deposition (CVD), or the like. The contacts 119 may be formed by forming openings in the dielectric material 117 to expose an underlying conductive feature (e.g., 115, 109, or 105), and filling the opening with an electrically conductive material, such as copper, tungsten, cobalt, gold, silver, alloys thereof, combinations thereof, or the like.

Next, connectors 121 (also referred to as conductive connectors or conductive bumps) are formed over and electrically coupled to the contacts 119. The connectors 121 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 121 may include a conductive material such as solder, copper, aluminum, gold, nickel, silver, palladium, tin, the like, or a combination thereof. In some embodiments, the connectors 121 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. The connectors 121 may form a grid, such as a ball grid array (BGA). In some embodiments, a reflow process may be performed, giving the connectors 121 a shape of a partial sphere in some embodiments. Alternatively, the connectors 121 may comprise other shapes. The connectors 121 may also comprise non-spherical conductive connectors, for example.

In some embodiments, the connectors 121 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Figure 8B:
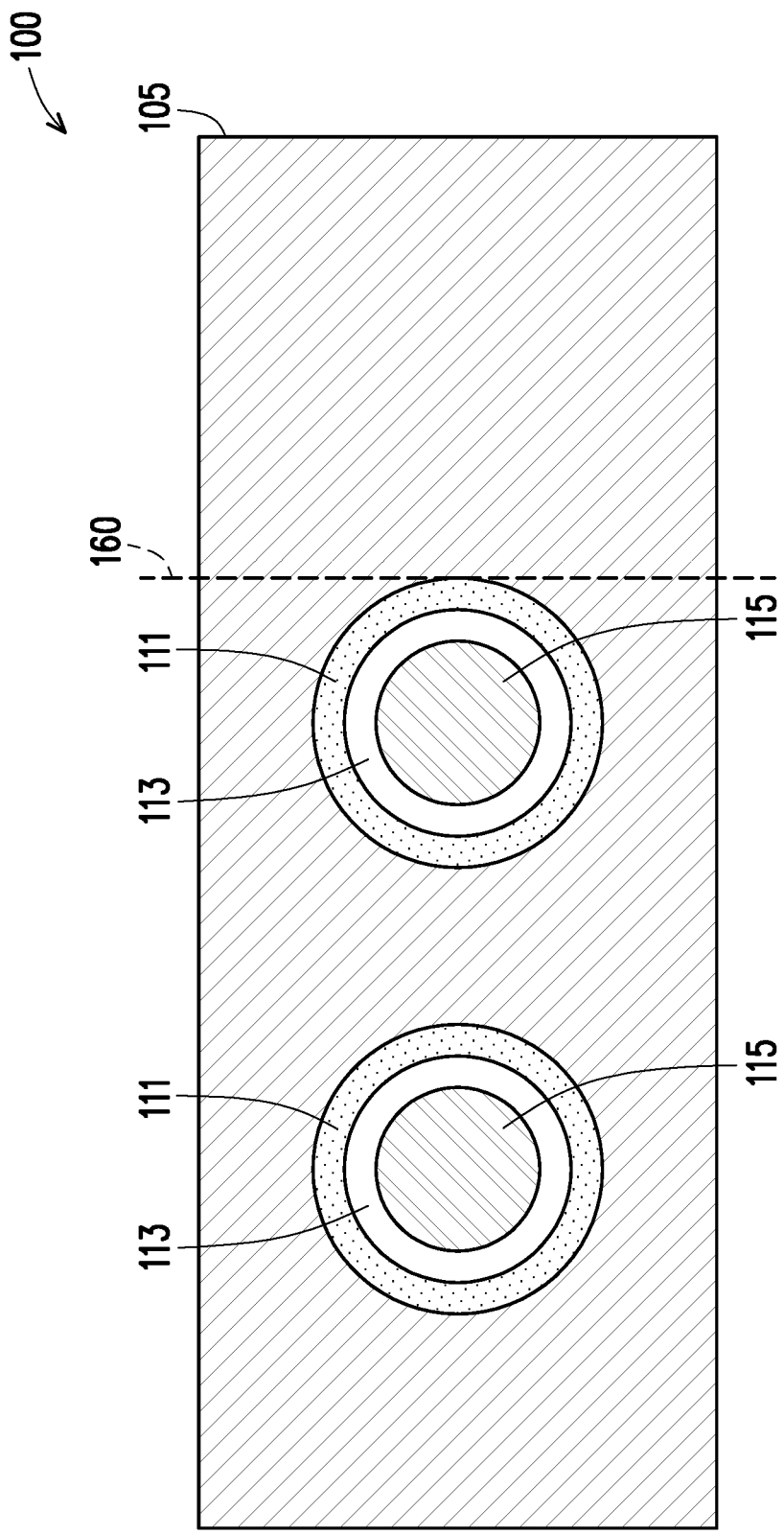

FIG. 8B illustrates the 3D memory device of FIG. 8A, but along cross-section A-A in FIG. 8A. In the cross-sectional view of FIG. 8B, the ferroelectric material 113 surrounds (e.g., encircles) the gate electrode 115, and the channel material 11 surrounds the ferroelectric material 113. The region to the right of the dashed line 160 corresponds to the staircase shaped region 150 of the 3D memory device 100.

Referring back to FIG. 8A, the dashed box in FIG. 8A illustrates a memory cell 123 of the 3D memory device 100. The 3D memory device 100 includes a plurality of such memory cells. The memory cell 123 includes the gate electrode 115, source/drain layers 105/109, the dielectric layer 107, the channel material 11 between the source/drain layers 105/109 of a same layer stack 108, and portions of the ferroelectric material 113 between the gate electrode 115 and the layer stack 108 of the memory cell. Therefore, each of the memory cells of the 3D memory device 100 is a transistor with the ferroelectric material 113, in the illustrated embodiment. The dashed arrows 125 in FIG. 8A illustrate possible current flow directions in the channel layer when the transistor of the memory cell is turned on.

In the example of FIG. 8A, four memory cells are illustrated. To avoid clutter, besides the memory cell 123, the other memory cells are not marked by dashed boxes. The memory cell 123 can be programmed (e.g., written and/or read) through connectors 121 that are electrically coupled to the gate and the source/drain terminals of the transistor of the memory cell, e.g., connectors 121 labeled Vg1, Vs1 and Vd1. Similarly, connectors 121 labeled Vg1, Vs2, Vd2 can be used to program a second memory cell, connectors labeled Vg2, Vs1, Vd1 can be used to program a third memory cell, and connectors 121 labeled Vg2, Vs2, Vd2 can be used to program a fourth memory cell.

To perform a write operation on a particular memory cell, e.g., the memory cell 123, a write voltage is applied across a portion of the ferroelectric material 113 corresponding to the memory cell 123. The write voltage may be applied, for example, by applying a first voltage to the gate electrode 115 of the memory cell 123 (through the connector 121 labeled Vg1), and applying a second voltage to the source/drain layers 105/109 (through connectors 121 labeled Vs1/D1 or Vs2/D2). The voltage difference between the first voltage and the second voltage sets the polarization direction of the ferroelectric material 113. Depending on the polarization direction of the ferroelectric material 113, the threshold voltage $V_T$ of the corresponding transistor of the memory cell 123 can be switched from a low threshold voltage $V_L$ to a high threshold voltage $V_H$, or vice versa. The threshold voltage value ($V_L$ or $V_H$) of the transistor can be used to indicate a bit of "0" or a "1" stored in the memory cell.

To perform a read operation on the memory cell 123, a read voltage, which is a voltage between the low threshold voltage $V_L$ and the high threshold voltage $V_H$, is applied to the transistor, e.g., between the gate electrode 115 and the second source/drain layer 109. Depending on the polarization direction of the ferroelectric material 113 (or the threshold voltage of the transistor), the transistor of the memory cells 123 may or may not be turned on. As a result, when a voltage is applied, e.g., at the first source/drain layer 105, an electrical current may or may not flow between the first source/drain layer 105 and the second source/drain layer 109 through the channel material 11. The electrical current may thus be detected to determine the digital bit stored in the memory cell.

Note that by selectively forming the channel material 11 on the sidewalls of the layer stacks 108 and not on the sidewall of the isolation layer 103B, the channel material 11 of the first layer stack 108A is separated from the channel material 11 of the second layer stack 108B, which advantageously prevents or reduces leakage current between two vertically-stacked neighboring memory cells.

Figure 9A:
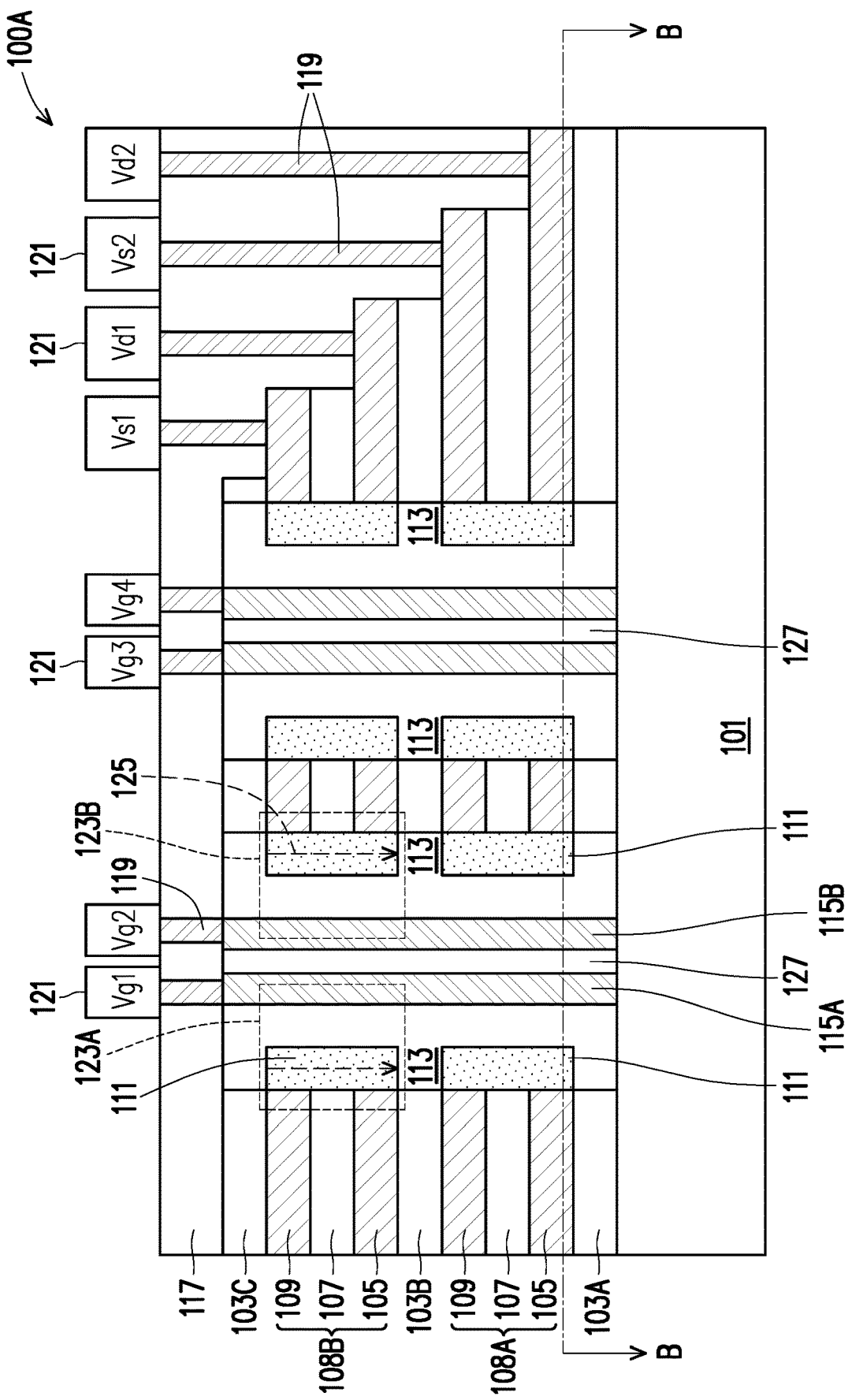
FIGS. 9A and 9B illustrate cross-sectional views of a three-dimensional memory device, in another embodiment.
Figure 9B:
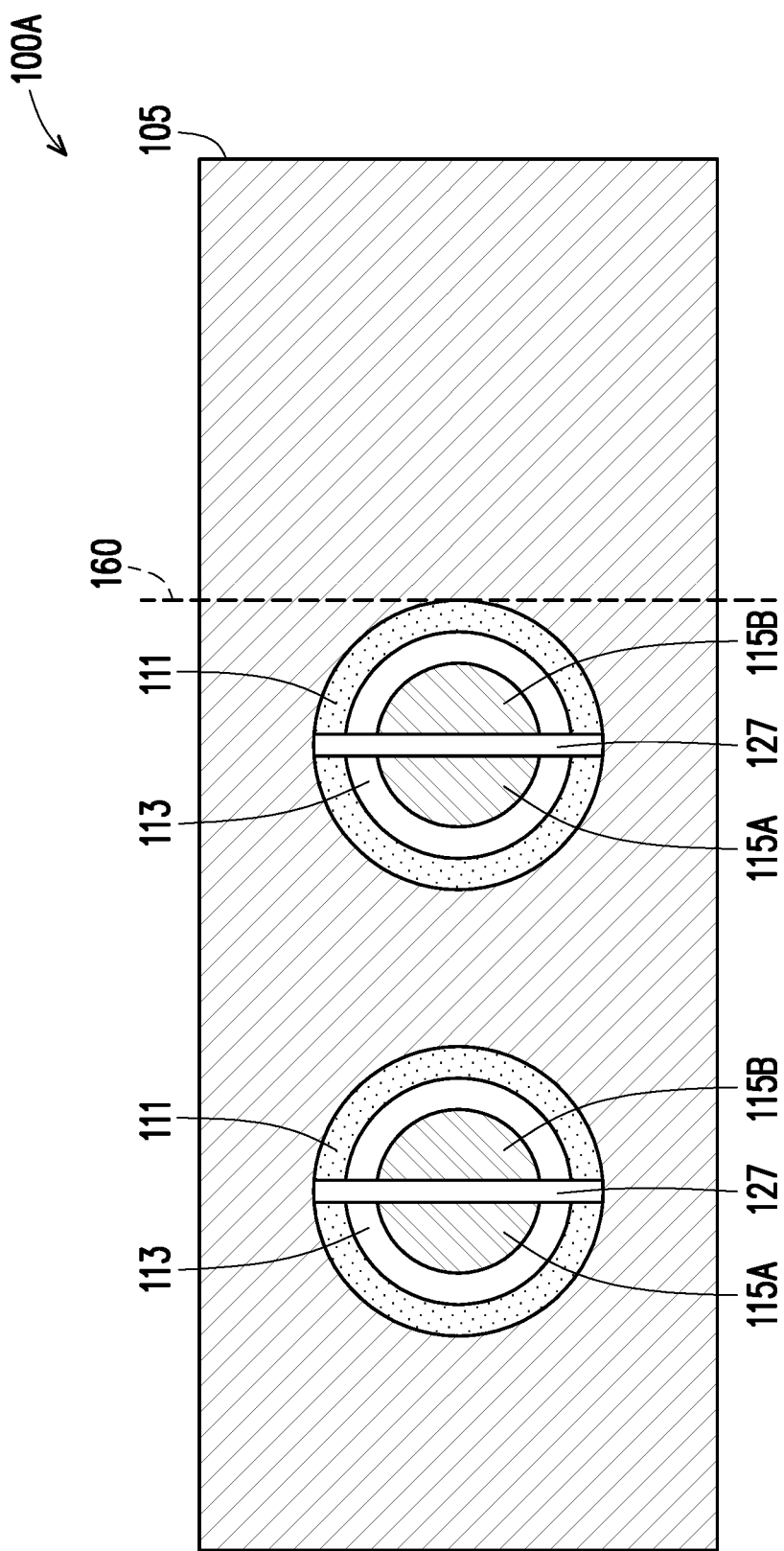

FIGS. 9A and 9B illustrate cross-sectional views of a three-dimensional (3D) memory device 100A, in another embodiment. The 3D memory device 100A is similar to the 3D memory device 100 of FIG. 8A, but with additional processing to increase (e.g., double) the memory cell density.

In some embodiments, to form the 3D memory device 100A, the processing steps in FIGS. 1-7 for the 3D memory device 100 are followed. Next, a slot shaped opening is formed in each of the gate electrode 115. The slot shaped opening extends vertically from an upper surface of the gate electrode 115 distal from the substrate 101 to a lower surface of the gate electrode 115 facing the substrate 101. In a top view, the slot shaped opening extends along, e.g., a diameter of the gate electrode 115 and separates the gate electrode 115 into two separate gate electrodes 115A and 115B (see FIG. 9B). The slot shaped opening also extends into the ferroelectric material 113 and the channel material 11, and cuts each of the ferroelectric material 113 and the channel material 11 into two separate segments, in the illustrated example of FIG. 9B.

Next, as illustrated in FIG. 9A, a dielectric material 127, such as silicon oxide, silicon nitride, or the like, is formed to fill the slot shaped openings. The dielectric material 127 electrically isolates the gate electrodes 115A and 115B. Next, the dielectric material 117 is formed over the isolation layer 103C, and contacts 119 are formed in the dielectric material 117 to electrically couple to respective underlying conductive features (e.g., gate electrodes 115A/115B, or source/drain layers 105/109). Next, connectors 121 are formed over and electrically coupled to the respective contacts 119. FIG. 9B shows the cross-sectional view of the 3D memory device 100A of FIG. 9A, but along cross-section B-B in FIG. 9A. In some embodiments, the filling of the slot shaped openings and the formation of the dielectric material 117 are performed together in a same deposition process, and therefore, the dielectric material 127 filling the slot shaped openings is the same as the dielectric material 117 over the isolation layer 103C.

Due to the dielectric material 127 separating the gate electrode 115 into two separate, independently controlled (e.g., having different gate control voltages) gate electrodes 115A and 115B, the number of memory cells in the 3D memory device 100A is double that of the 3D memory device 100. The dashed boxes 123A and 123B in FIG. 9A show two memory cells formed in a region that corresponds to the memory cell 123 in FIG. 8A. As illustrated in FIG. 9A, each of the memory cells 123A/123B is half the size of the memory cell 123 in FIG. 8A. In the example of FIG. 9A, there are four connectors 121 (labeled Vg1, Vg2, Vg3, and Vg4), each of which is electrically coupled to a gate of a transistor of a memory cell. In addition, there are two pairs of connectors 121, labeled Vs1/Vd1 and Vs2/Vd2, where each pair is coupled to the source/drain layers 105/109 of a transistor of a memory cell. Therefore, the example of FIG. 9A illustrates eight memory cells, where each of the memory cells can be programmed by applying appropriate voltages to the gate and source/drain terminals of the transistor of each memory cell.

Figure 10:
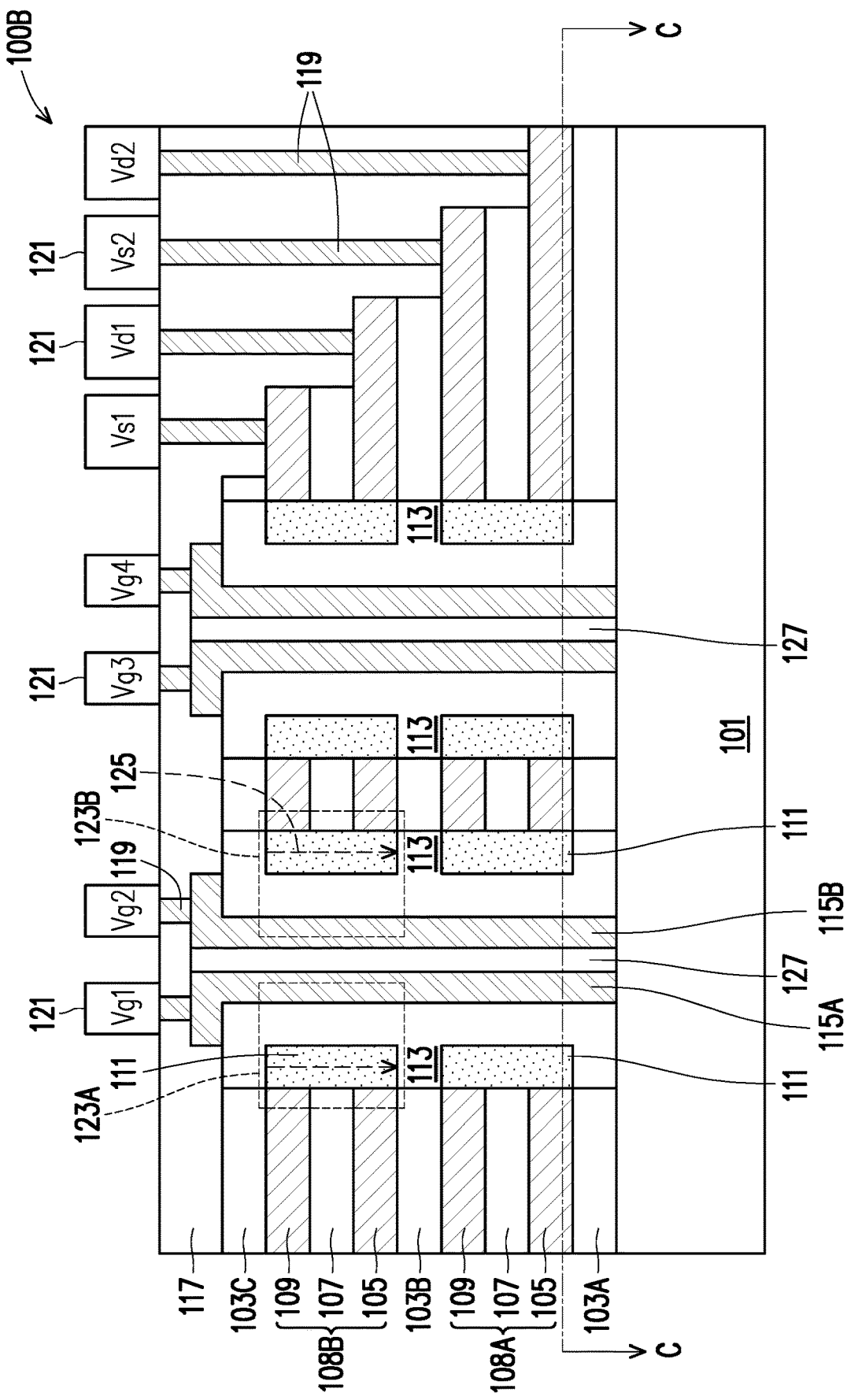
FIG. 10 illustrates a cross-sectional view of a three-dimensional memory device, in another embodiment.

FIG. 10 illustrates a cross-sectional view of a three-dimensional (3D) memory device 100B, in another embodiment. The 3D memory device 100B is similar to the 3D memory device 100A of FIG. 9A, but each of the gate electrodes 115A and 115B has a top portion that extends along an upper surface of the ferroelectric material 113, and therefore, the gate electrode 115A (or 115B) has an L-shaped cross-section. The top portion of the gate electrodes 115A/115B allows for more flexibility in choosing the locations of the connectors 121 coupled to the gate electrodes. The cross-sectional view of the 3D memory device 100B along cross-section C-C is the same as that in FIG. 9B, thus not repeated.

Figure 11:
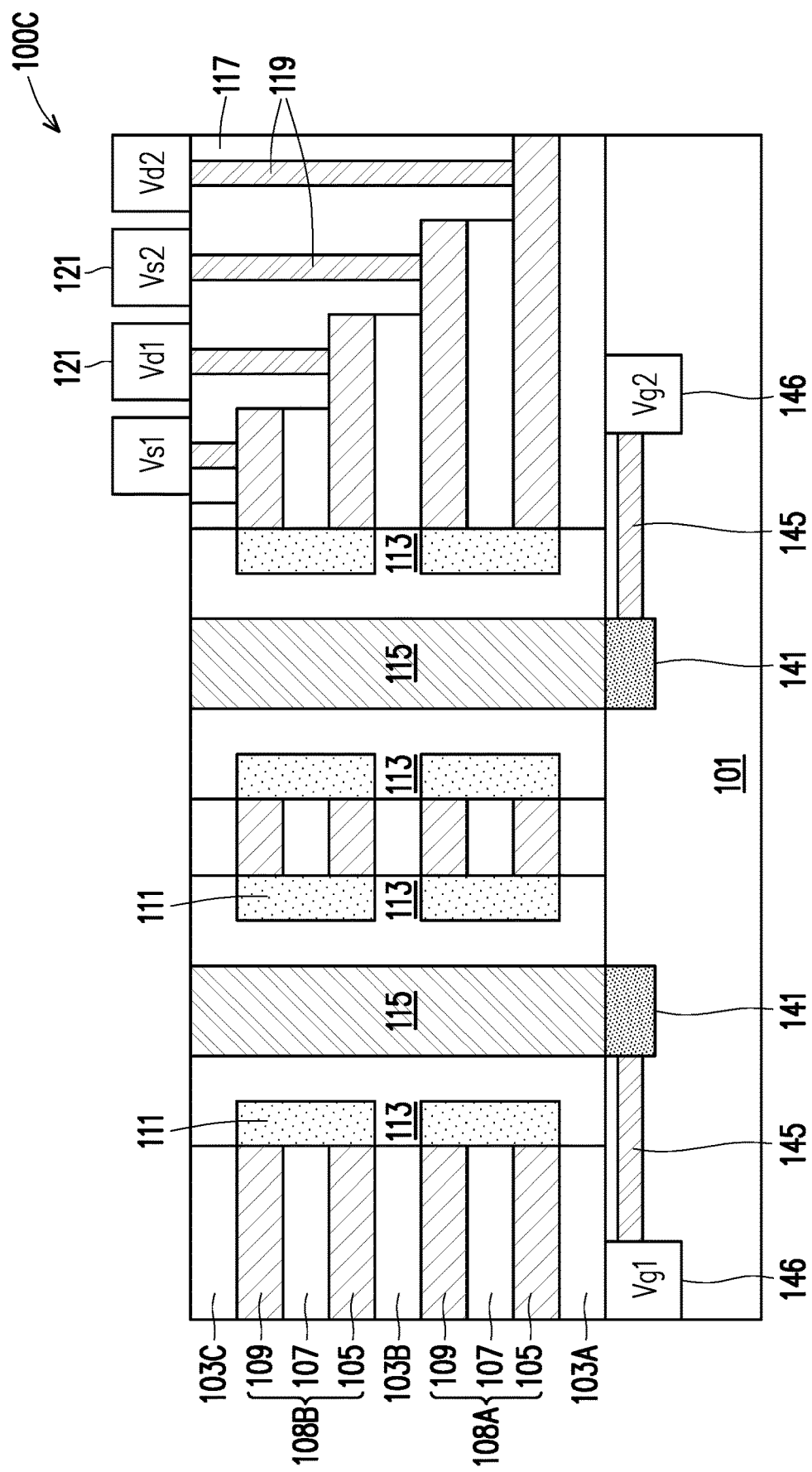
FIG. 11 illustrates a cross-sectional view of a three-dimensional memory device, in another embodiment.

FIG. 11 illustrates a cross-sectional view of a three-dimensional (3D) memory device 100C, in another embodiment. The 3D memory device 100C is similar to the 3D memory device 100 of FIG. 8A, but the connectors 121 labeled Vg1 and Vg2 in FIG. 8A are replaced by electrically conductive features 146 in the substrate 101. The electrically conductive features 146 may be formed as part of the interconnect structures of the substrate 101. In addition, electrically conductive regions 141 are formed in the substrate 101 under (e.g., directly under and physically contacts) and electrically coupled to the gate electrodes 115. In some embodiments, the electrically conductive regions 141 are epitaxial regions comprising an epitaxially grown semiconductor material. In some embodiments, the electrically conductive regions 141 are doped regions, e.g., semiconductor regions doped with a N-type or P-type dopant. FIG. 11 also illustrates conductive lines 145 in the substrate 101 connecting the electrically conductive features 146 with respective electrically conductive regions 141. The conductive lines 145 may be conductive lines in the interconnect structures of the substrate 101. The gate control voltages of the 3D memory device 100C are applied to the gate electrodes 115 through the electrically conductive feature 146. Note that the dielectric material 117 in FIG. 11 has a coplanar upper surface with the isolation layer 103C and the ferroelectric material 113.

Figure 12:
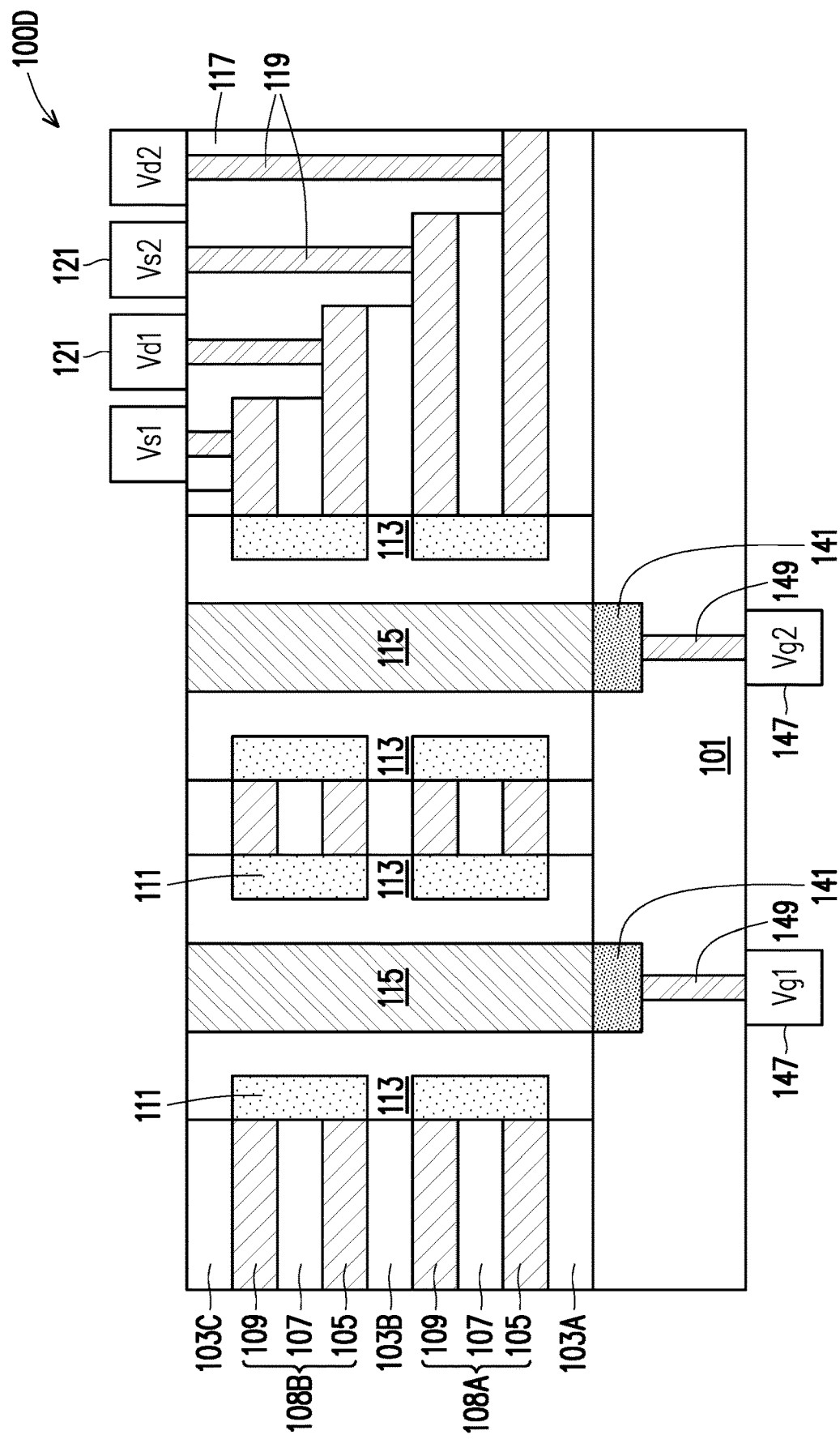
FIG. 12 illustrates a cross-sectional view of a three-dimensional memory device, in another embodiment.

FIG. 12 illustrates a cross-sectional view of a three-dimensional (3D) memory device 100D, in another embodiment. The 3D memory device 100D is similar to the 3D memory device 100C of FIG. 11, but the electrically conductive regions 141 are electrically coupled to connectors 147 at the lower surface of the substrate 101 by through-substrate vias (TSVs) 149. Therefore, the gate control voltages of the 3D memory device 100D are applied at the connectors 147.

Figure 13A:
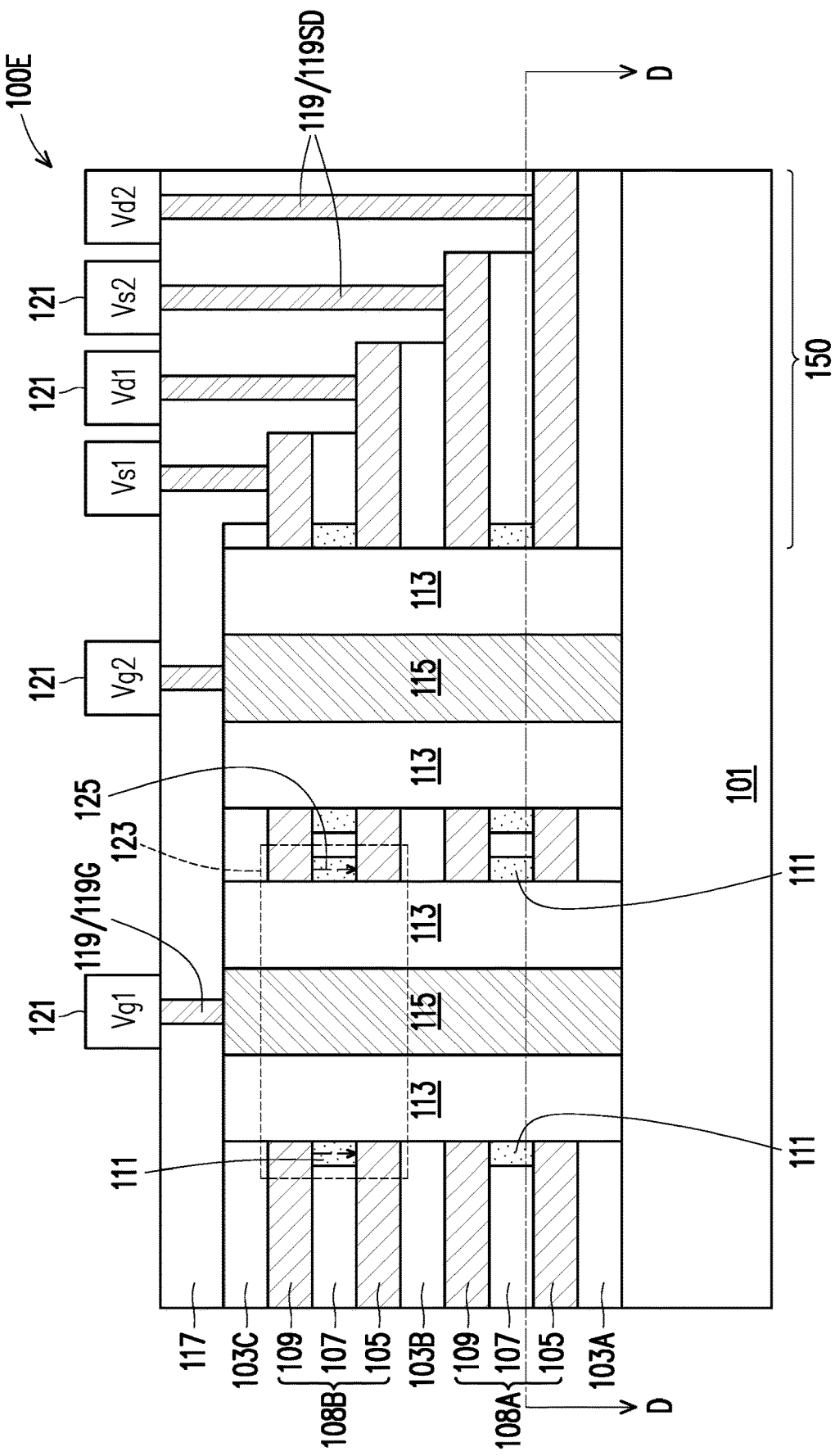
FIGS. 13A and 13B illustrate cross-sectional views of a three-dimensional memory device, in yet another embodiment.
Figure 13B:
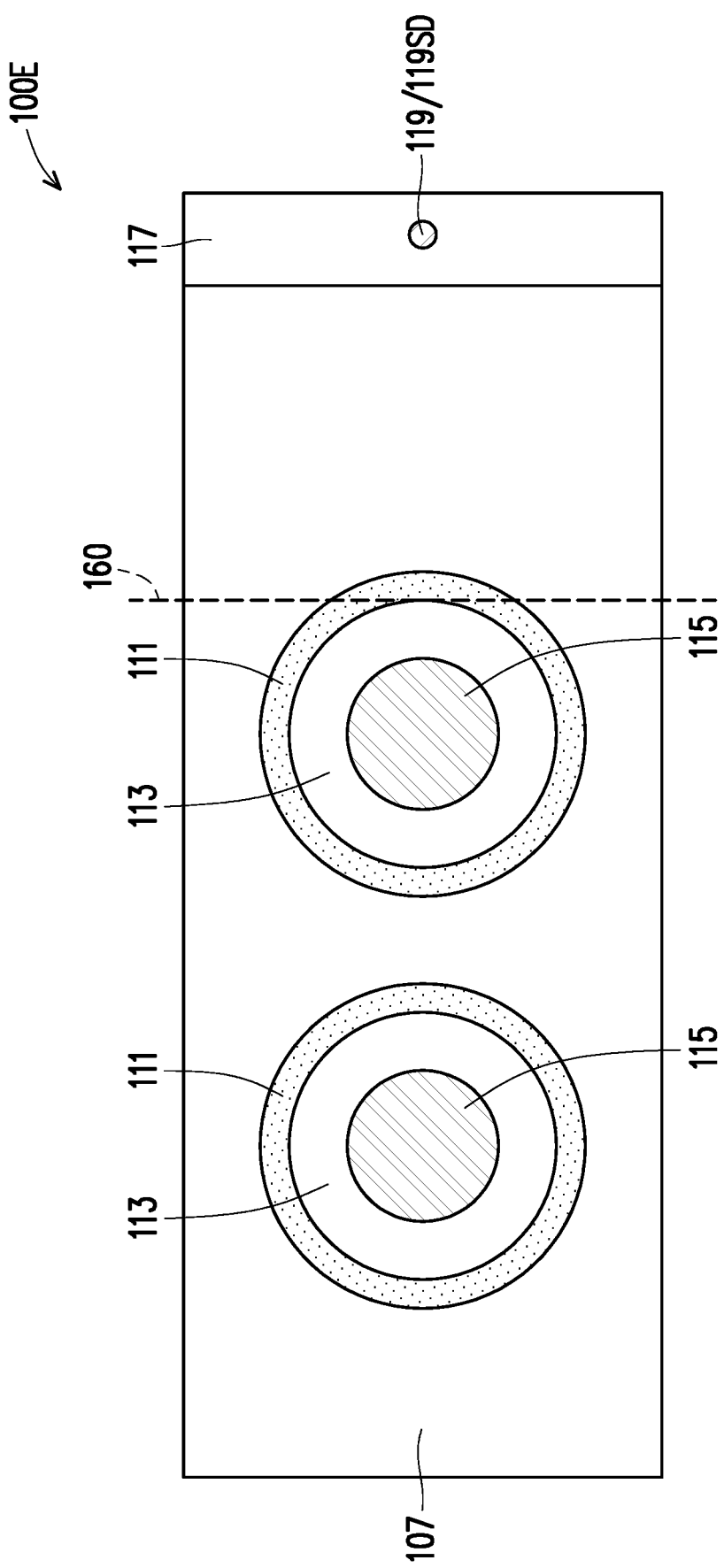

FIGS. 13A and 13B illustrate cross-sectional views of a three-dimensional memory device 100E, in yet another embodiment. The 3D memory device 100E is similar to the 3D memory device 100 of FIGS. 8A and 8B, but with the channel material 111 formed in recessed regions of the dielectric layers 107. In particular, after the processing of FIG. 3 is performed to form the openings 106, a selective etching process using an etchant selective to (e.g., having a higher etch rate for) the material of the dielectric layers 107 is performed to recess the dielectric layers 107, such that sidewalls of the dielectric layers 107 are recessed from sidewalls of the source/drain layers 105/109. For ease of discussion, recesses in the dielectric layers 107 formed by the above selective etching process may be referred to as sidewall recesses of the dielectric layers 107. Next, the channel material 111 is formed to fill the sidewall recesses of the dielectric layers 107. For example, a conformal deposition method, such as ALD, is performed to form the channel material 111, which channel material 111 lines the sidewalls and bottoms of the openings 106 and fills the sidewall recesses of the dielectric layers 107. Next, a suitable etching process, such as a dry etch, a wet etch, or combinations thereof, is performed to remove portions of the channel material 111 disposed outside the sidewall recesses of the dielectric layers 107. As illustrated in FIG. 13A, after the above processing steps, the channel material 111 is disposed in the sidewall recesses of the dielectric layers 107 between respective source/drain layers 105/109 of the layer stacks 108. In other words, in each layer stack 108, the channel material 111 extends along a sidewall of the dielectric layer 107 facing the subsequently formed gate electrode 115. In the example of FIG. 13A, the sidewall of the channel material 11 is aligned (e.g., vertically) with sidewalls of the source/drain layers 105/109. In other embodiments, the sidewall of the channel material 11 may be recessed from, or protrude from, the sidewalls of the source/drain layers 105/109. Regardless of the shape of the sidewall of the channel material 11, the channel material 11 in different layer stacks (e.g., 108A, 108B) are separated from each other, as illustrated in FIG. 13A. Subsequent processing steps to form the ferroelectric material 113, the gate electrodes 115, the staircase shaped region 150, and the contacts 119 are the same as or similar to those discussed above with reference to FIGS. 5-7, 8A and 8B, thus details are not repeated. FIG. 13B illustrates the cross-sectional view of the 3D memory device 100E along cross-section D-D of FIG. 13A.

Modification or variations to the disclosed embodiments are possible and are fully intended to be included within the scope of the present disclosure. For example, each of the gate electrodes 115 in FIGS. 11, 12, and 13A may be separated by the dielectric material 127 to form two separate gate electrodes, similar to the processing illustrated in FIGS. 9A and 9B, thereby doubling the number of memory cells in the 3D memory device. As another example, while the disclosed embodiments illustrate two layer stacks 108 with isolation layer 103 in between being formed over the substrate 101, these embodiments are illustrative and not limiting. One skilled in the art will readily appreciate that more than two layer stacks 108 may be formed over the substrate 101 with isolation layers 103 in between. This would allow more memory cells to be formed in the 3D memory device. As yet another example, the channel material 111 in 3D memory devices 100A, 100B, 100C, and 100D may be modified to be located in the recessed regions of the dielectric layers 107, same as or similar to the channel material 111 of 3D memory device 100E.

Embodiments may achieve advantages. For example, by selectively forming the channel material 11 on the sidewalls of the layer stacks 108, leakage current between two vertically neighboring memory cells may be reduced or eliminated, thereby improving the device performance. The disclosed embodiments allows for easy modification to increase the number of memory cells in the memory device, thus improving the memory cell density. The disclosed formation methods for the 3D memory devices can be easily integrated into existing BEOL process, thereby allowing integration of memory devices in various semiconductor devices at low production cost.

Figure 14:
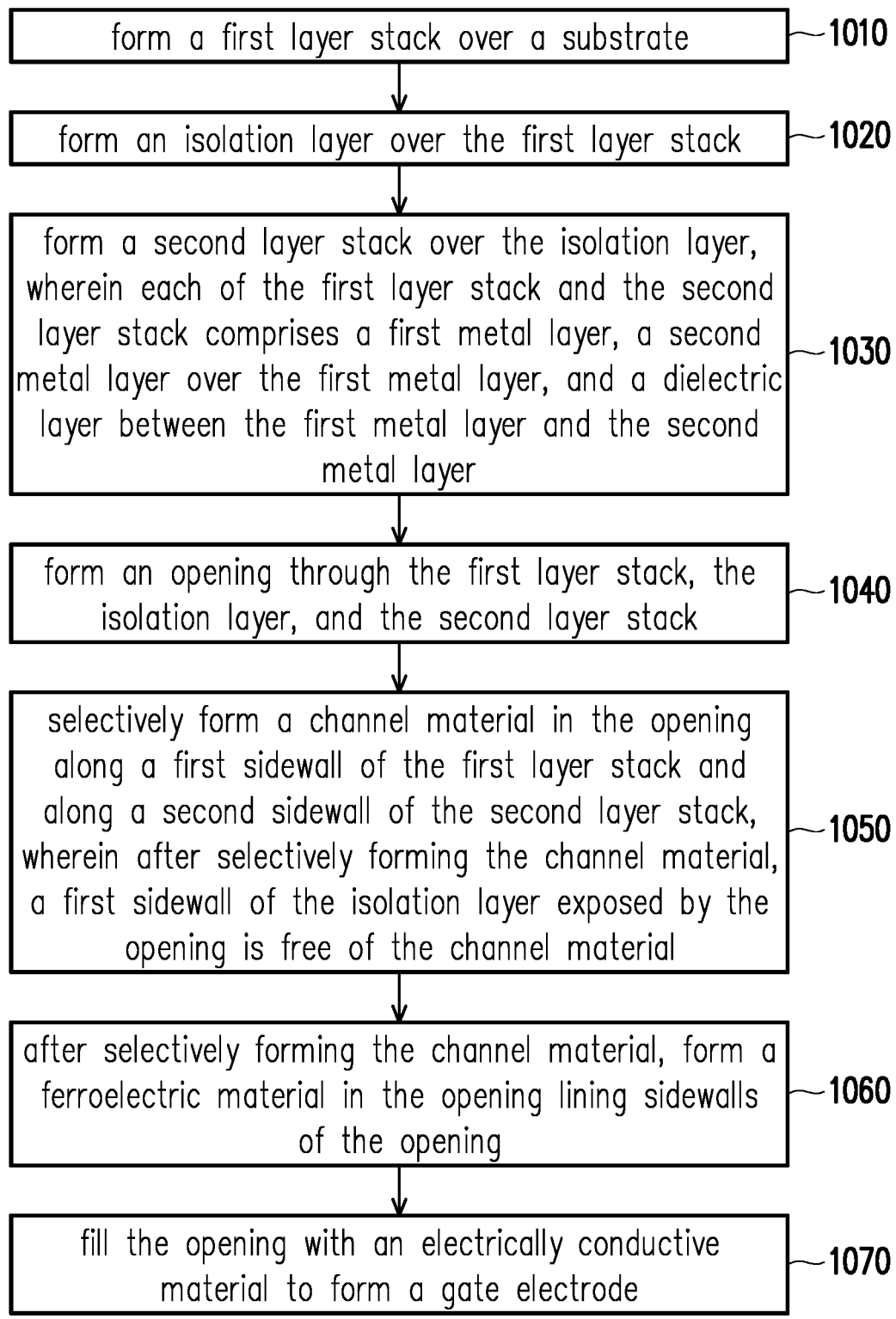
FIG. 14 illustrates a flow chart of a method of forming a three-dimensional memory device, in some embodiments.

FIG. 14 illustrates a flow chart of a method of forming a memory device, in some embodiments. It should be understood that the embodiment method shown in FIG. 14 is merely an example of many possible embodiment methods. One of ordinary skill in the art would recognize many variations, alternatives, and modifications. For example, various steps as illustrated in FIG. 14 may be added, removed, replaced, rearranged, or repeated.

Referring to FIG. 14, at block 1010, a first layer stack is formed over a substrate. At block 1020, an isolation layer is formed over the first layer stack. At block 1030, a second layer stack is formed over the isolation layer, wherein each of the first layer stack and the second layer stack comprises a first metal layer, a second metal layer over the first metal layer, and a dielectric layer between the first metal layer and the second metal layer. At block 1040, an opening is formed through the first layer stack, the isolation layer, and the second layer stack. At block 1050, a channel material is selectively formed in the opening along a first sidewall of the first layer stack and along a second sidewall of the second layer stack, wherein after selectively forming the channel material, a first sidewall of the isolation layer exposed by the opening is free of the channel material. At block 1060, after selectively forming the channel material, a ferroelectric material is formed in the opening lining sidewalls of the opening. At block 1070, the opening is filled with an electrically conductive material to form a gate electrode.

In accordance with an embodiment, a memory device includes: a first layer stack over a substrate, the first layer stack comprising a first source/drain layer, a second source/drain layer over the first source/drain layer, and a dielectric layer between the first source/drain layer and the second source/drain layer; an isolation layer over the first layer stack; a second layer stack over the isolation layer, the second layer stack comprising the first source/drain layer, the second source/drain layer over the first source/drain layer, and the dielectric layer between the first source/drain layer and the second source/drain layer; a first gate electrode extending through the first layer stack, the isolation layer, and the second layer stack; a first channel layer between the first gate electrode and the first layer stack, the first channel layer extending along a first sidewall of the first layer stack; a second channel layer between the first gate electrode and the second layer stack, wherein the second channel layer extends along a second sidewall of the second layer stack, wherein the first channel layer is spaced apart from the second channel layer; and a first ferroelectric layer at least partially between the first gate electrode and the first channel layer and between the first gate electrode and the second channel layer. In an embodiment, the first ferroelectric layer physically contacts the first channel layer and the second channel layer, and fills a gap between the first channel layer and the second channel layer. In an embodiment, a sidewall of the isolation layer facing the first gate electrode is free of the first channel layer and the second channel layer. In an embodiment, the first source/drain layer is a first metal layer, and the second source/drain layer is a second metal layer, wherein the first metal layer and the second metal layer comprise a same metal material. In an embodiment, the first channel layer and the second channel layer comprises a same metal oxide material. In an embodiment, the isolation layer and the dielectric layer comprise different dielectric materials. In an embodiment, the first channel layer and the second channel layer comprises a same channel material, wherein a first deposition rate of the channel material on the isolation layer is lower than a second deposition rate of the channel material on the first layer stack. In an embodiment, the memory device further includes: a gate contact electrically coupled to an upper surface of the first gate electrode distal from the substrate; and a conductive connector over and electrically coupled to the gate contact. In an embodiment, the memory device further includes: an epitaxial layer or a doped region in the substrate under the first gate electrode, wherein the epitaxial layer or the doped region is electrically coupled to a lower surface of the first gate electrode facing the substrate; a conductive feature in the substrate; and a conductive line in the substrate connecting the conductive feature and the epitaxial layer or the doped region. In an embodiment, the memory device further includes: an epitaxial layer or a doped region in the substrate under the first gate electrode, wherein the epitaxial layer or the doped region is electrically coupled to a lower surface of the first gate electrode facing the substrate; a conductive connector at a first side of the substrate distal from the first gate electrode; and a through-substrate via (TSV) extending through the substrate and coupling the conductive connector with the epitaxial layer or the doped region. In an embodiment, the first ferroelectric layer extends along a first sidewall of the first gate electrode, wherein the memory device further comprises: a second gate electrode adjacent to the first gate electrode; and a dielectric material between and contacting the first gate electrode and the second gate electrode, wherein the dielectric material separates the first gate electrode from the second gate electrode. In an embodiment, the memory device further includes: a second gate electrode extending through the first layer stack and the second layer stack; a third channel layer between the second gate electrode and the first layer stack, the third channel layer extending along a third sidewall of the first layer stack;

a fourth channel layer between the second gate electrode and the second layer stack, wherein the fourth channel layer extends along a fourth sidewall of the second layer stack, wherein the third channel layer is spaced apart from the fourth channel layer; and a second ferroelectric layer at least partially between the second gate electrode and the third channel layer and between the second gate electrode and the fourth channel layer.

In accordance with an embodiment, a memory device includes: a first layer stack and a second layer stack over a substrate, wherein the first layer stack is between the substrate and the second layer stack, wherein each of the first layer stack and the second layer stack comprises a first metal layer, a second metal layer over the first metal layer, and a first dielectric material between the first metal layer and the second metal layer; a second dielectric material between the first layer stack and the second layer stack; a gate electrode extending through the first layer stack, the second dielectric material, and the second layer stack; a ferroelectric material extending along a sidewall of the gate electrode, wherein the ferroelectric material is between the gate electrode and the first layer stack and between the gate electrode and the second layer stack; and a channel material, wherein a first portion of the channel material is between the ferroelectric material and the first layer stack, and extends along a first sidewall of the first layer stack, wherein a second portion of the channel material is between the ferroelectric material and the second layer stack, and extends along a second sidewall of the second layer stack, wherein the first portion of the channel material is separated from the second portion of the channel material. In an embodiment, the ferroelectric material extends into a gap between the first portion of the channel material and the second portion of the channel material. In an embodiment, a sidewall of the second dielectric material facing the gate electrode is free of the channel material. In an embodiment, the channel material is a metal oxide.

In accordance with an embodiment, a method of forming a memory device includes: forming a first layer stack over a substrate; forming an isolation layer over the first layer stack; forming a second layer stack over the isolation layer, wherein each of the first layer stack and the second layer stack comprises a first metal layer, a second metal layer over the first metal layer, and a dielectric layer between the first metal layer and the second metal layer; forming an opening through the first layer stack, the isolation layer, and the second layer stack; selectively forming a channel material in the opening along a first sidewall of the first layer stack and along a second sidewall of the second layer stack, wherein after selectively forming the channel material, a first sidewall of the isolation layer exposed by the opening is free of the channel material; after selectively forming the channel material, forming a ferroelectric material in the opening lining sidewalls of the opening; and filling the opening with an electrically conductive material to form a gate electrode. In an embodiment, after forming the ferroelectric material, the ferroelectric material covers an upper surface of the channel material facing away from the substrate, a lower surface of the channel material facing the substrate, and a sidewall of the channel material facing the opening. In an embodiment, the ferroelectric material contacts the first sidewall of the isolation layer. In an embodiment, the method further includes: after filling the opening, forming a recess in the gate electrode, the recess separating the gate electrode into two separate segments; and filling the recess with a dielectric material.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory device comprising:
a first layer stack over a substrate, the first layer stack comprising a first source/drain layer, a second source/drain layer over the first source/drain layer, and a first dielectric layer between the first source/drain layer and the second source/drain layer;
an isolation layer over the first layer stack;
a second layer stack over the isolation layer, the second layer stack comprising a third source/drain layer, a fourth source/drain layer over the third source/drain layer, and a second dielectric layer between the third source/drain layer and the fourth source/drain layer;
a first gate electrode extending through the first layer stack, the isolation layer, and the second layer stack;
a first channel layer between the first gate electrode and the first layer stack, the first channel layer extending along a first sidewall of the first layer stack;
a second channel layer between the first gate electrode and the second layer stack, wherein the second channel layer extends along a second sidewall of the second layer stack, wherein the first channel layer is spaced apart from the second channel layer; and
a first ferroelectric layer at least partially between the first gate electrode and the first channel layer and between the first gate electrode and the second channel layer, wherein the first ferroelectric layer physically contacts the first channel layer and the second channel layer.

2. The memory device of claim 1, wherein the first ferroelectric layer fills a gap between the first channel layer and the second channel layer.

3. The memory device of claim 1, wherein a sidewall of the isolation layer facing the first gate electrode is free of the first channel layer and the second channel layer.

4. The memory device of claim 1, wherein the first source/drain layer is a first metal layer, and the second source/drain layer is a second metal layer, wherein the first metal layer and the second metal layer comprise a same metal material.

5. The memory device of claim 4, wherein the first channel layer and the second channel layer comprise a same metal oxide material.

6. The memory device of claim 1, wherein the isolation layer and the first dielectric layer comprise different dielectric materials.

7. The memory device of claim 1, further comprising:
a gate contact electrically coupled to an upper surface of the first gate electrode distal from the substrate; and
a conductive connector over and electrically coupled to the gate contact.

8. The memory device of claim 1, further comprising:
an epitaxial layer or a doped region in the substrate under the first gate electrode, wherein the epitaxial layer or the doped region is electrically coupled to a lower surface of the first gate electrode facing the substrate;
a conductive feature in the substrate; and
a conductive line in the substrate connecting the conductive feature and the epitaxial layer or the doped region.

9. The memory device of claim 1, further comprising:
an epitaxial layer or a doped region in the substrate under the first gate electrode, wherein the epitaxial layer or the doped region is electrically coupled to a lower surface of the first gate electrode facing the substrate;
a conductive connector at a first side of the substrate distal from the first gate electrode; and
a through-substrate via (TSV) extending through the substrate and coupling the conductive connector with the epitaxial layer or the doped region.

10. The memory device of claim 1, wherein the first ferroelectric layer extends along a first sidewall of the first gate electrode, wherein the memory device further comprises:
a second gate electrode adjacent to the first gate electrode; and
a dielectric material between and contacting the first gate electrode and the second gate electrode, wherein the dielectric material separates the first gate electrode from the second gate electrode.

11. The memory device of claim 1, further comprising:
a second gate electrode extending through the first layer stack and the second layer stack;
a third channel layer between the second gate electrode and the first layer stack, the third channel layer extending along a third sidewall of the first layer stack;
a fourth channel layer between the second gate electrode and the second layer stack, wherein the fourth channel layer extends along a fourth sidewall of the second layer stack, wherein the third channel layer is spaced apart from the fourth channel layer; and
a second ferroelectric layer at least partially between the second gate electrode and the third channel layer and between the second gate electrode and the fourth channel layer.

12. The memory device of claim 1, wherein the first source/drain layer, the second source/drain layer, the third source/drain layer, and the fourth source/drain layer comprise a same material, wherein the first dielectric layer and the second dielectric layer comprise a same material.

13. The memory device of claim 1, wherein the first ferroelectric layer covers an upper surface of the second channel layer facing away from the substrate, and covers a lower surface of the first channel layer facing the substrate.

14. The memory device of claim 1, wherein the first ferroelectric layer physically contacts a sidewall of the isolation layer facing the first gate electrode.

15. A memory device comprising:
a first layer stack and a second layer stack over a substrate, wherein the first layer stack is between the substrate and the second layer stack, wherein each of the first layer stack and the second layer stack comprises a first metal layer, a second metal layer over the first metal layer, and a first dielectric material between the first metal layer and the second metal layer;
a second dielectric material between the first layer stack and the second layer stack;
a gate electrode extending through the first layer stack, the second dielectric material, and the second layer stack;
a ferroelectric material extending along a sidewall of the gate electrode, wherein the ferroelectric material is between the gate electrode and the first layer stack and between the gate electrode and the second layer stack; and
a channel material, wherein a first portion of the channel material is between the ferroelectric material and the first layer stack, and extends along a first sidewall of the first layer stack, wherein a second portion of the channel material is between the ferroelectric material and the second layer stack, and extends along a second sidewall of the second layer stack, wherein the first portion of the channel material is separated from the second portion of the channel material, wherein the ferroelectric material extends into a gap between the first portion of the channel material and the second portion of the channel material.

16. The memory device of claim 15, wherein a sidewall of the second dielectric material facing the gate electrode is free of the channel material.

17. The memory device of claim 16, wherein the channel material is a metal oxide.

18. A method of forming a memory device, the method comprising:
forming a first layer stack over a substrate;
forming an isolation layer over the first layer stack;
forming a second layer stack over the isolation layer, wherein each of the first layer stack and the second layer stack comprises a first metal layer, a second metal layer over the first metal layer, and a dielectric layer between the first metal layer and the second metal layer;
forming an opening through the first layer stack, the isolation layer, and the second layer stack;
selectively forming a channel material in the opening along a first sidewall of the first layer stack and along a second sidewall of the second layer stack, wherein after selectively forming the channel material, a first sidewall of the isolation layer exposed by the opening is free of the channel material;
after selectively forming the channel material, forming a ferroelectric material in the opening lining sidewalls of the opening, wherein after forming the ferroelectric material, the ferroelectric material covers an upper surface of the channel material facing away from the substrate, a lower surface of the channel material facing the substrate, and a sidewall of the channel material facing the opening; and
filling the opening with an electrically conductive material to form a gate electrode.

19. The method of claim 18, wherein the ferroelectric material contacts the first sidewall of the isolation layer.

20. The method of claim 18, further comprising:
after filling the opening, forming a recess in the gate electrode, the recess separating the gate electrode into two separate segments; and
filling the recess with a dielectric material.

* * * * *